United States Patent [19]
Chang et al.

[11] Patent Number: 4,623,912
[45] Date of Patent: Nov. 18, 1986

[54] NITRIDED SILICON DIOXIDE LAYERS FOR SEMICONDUCTOR INTEGRATED CIRCUITS

[75] Inventors: Chuan C. Chang, Warren; Dawon Kahng, Bridgewater; Avid Kamgar, Millington; Louis C. Parrillo, Warren, all of N.J.

[73] Assignee: AT&T Bell Laboratories, Murray Hill, N.J.

[21] Appl. No.: 678,569

[22] Filed: Dec. 5, 1984

[51] Int. Cl.$^4$ ............................................. H01L 29/34
[52] U.S. Cl. ..................................... 357/54; 357/23.15
[58] Field of Search ......................... 357/54, 52, 23.15

[56] References Cited
U.S. PATENT DOCUMENTS

| | | | |
|---|---|---|---|
| 4,097,889 | 6/1978 | Kern et al. | 357/54 |
| 4,113,515 | 9/1978 | Kooi et al. | 357/54 X |
| 4,131,902 | 12/1978 | Kub | 357/54 X |
| 4,214,919 | 7/1980 | Young | 357/54 X |
| 4,365,264 | 12/1982 | Mukoi et al. | 357/54 |
| 4,543,707 | 10/1985 | Ito et al. | 357/54 |

OTHER PUBLICATIONS

"Recrystallization of Polysilicon Films Using Incoherent Light," *Materials Letters*, vol. 1, No. 3, 4 (Dec. 1982), pp. 91-94, by A. Kamgar and E. Labate.
"Thermal Nitridation of Silicon in Ammonia Gas: Composition and Oxidation Resistance of the Resulting Films," *J. Electrochemical Society*, vol. 126, No. 6 (Jun. 1979), pp. 996-1003, by S. P. Murarka et al.
"Low Pressure Nitrided-Oxide as a Thin Gate Dielectric for MOSFET's," *J. Electrochemical Society*, vol. 130, No. 5 (May 1983), pp. 1139-1144, by S. S. Wong et al.
"A Multiwafer Plasma System for Anodic Nitridation and Oxidation," *IEEE Electron Device Letters*, vol. ED-L-5, No. 5 (May 1984), pp. 175-177, by S. S. Wong et al.
"Direct Thermal Nitridation of Silicon Dioxide Films in Anhydrous Ammonia Gas," *J. Electrochemical Society*, vol. 127, No. 9 (Sep. 1980), pp. 2053-2057, by T. Ito et al.
"Ammonia-Annealed SiO$_2$ Films for Thin-Gate Insulator," *Japanese Journal of Applied Physics*, vol. 21, Supp. 21-1 (1982), pp. 153-158, by I. Kato et al.

Primary Examiner—Martin H. Edlow
Attorney, Agent, or Firm—David I. Caplan

[57] ABSTRACT

A semiconductor integrated circuit includes a nitrided silicon dioxide layer typically 50 to 400 Angstroms thick located on a semiconductor medium. The nitrided layer is an original silicon dioxide layer that has been nitrided at its top surface, as by rapid (flash) heating in ammonia to about 1250 degrees C., in such a way that the resulting nitrided silicon dioxide layer is essentially a compound layer of silicon nitroxide on silicon dioxide in which the atomic concentration fraction of nitrogen falls from a value greater than 0.13 at the top surface of the compound layer to a value of about 0.13 within 30 Angstroms or less beneath the top surface, and advantageously to values of less than about 0.05 everywhere at distances greater than about 60 Angstroms or less beneath the top surface, except that the nitrogen fraction can rise to as much as about 0.10 in the layer at distances within about 20 Angstroms from the interface of the nitrided layer and the underlying semiconductor medium.

11 Claims, 5 Drawing Figures

I

NITRIDED SILICON DIOXIDE LAYERS FOR SEMICONDUCTOR INTEGRATED CIRCUITS

FIELD OF THE INVENTION

This invention relates to semiconductor devices and more particularly to silicon-integrated circuits which comprise silicon dioxide layers.

BACKGROUND OF THE INVENTION

Semiconductor integrated circuits comprise a multiplicity of transistor devices integrated at a major surface of a semiconductor medium, typically a monocrystalline silicon or gallium arsenide semiconductor chip. Silicon dioxide layers are useful in these integrated circuits for serving such purposes as gate oxide dielectric layers of MOS (metal oxide semiconductor) transistors and as passivation oxide dielectric layers located on the major surface of the semiconductor between transistors (whether MOS or not) for mutually electrically isolating the transistors.

In the art of MOS transistors in VLSI (very large scale integrated) circuits, the lateral size of each transistor is made as small as possible in order to fit as many transistors as possible on the major surface of a single semiconductor chip and to enhance the speed of circuit operation. As the lateral size of the transistor is thus made smaller, the thickness of the silicon dioxide gate dielectric ("gate oxide") layer separating the gate electrode of an MOS transistor from the underlying major surface of the semiconductor body ideally should be made correspondingly (but not necessarily linearly) smaller. More specifically, as the length of the gate channel (source-to-drain) in an MOS transistor is reduced to lengths below one micron, the thickness of the gate oxide is thus made smaller than about 200 Angstroms; however, impurities from the overlying gate electrode can then undesirably penetrate through the gate oxide to the interface of the oxide with the underlying semiconductor and thereby cause undesirable transistor threshold voltage shifts.

It is known in the art that the use of a silicon nitroxide (oxynitride) layer overlying a silicon dioxide layer as a gate oxide of an MOS transistor can act as an effective barrier (or seal) against the undesirable penetration through the gate oxide by many impurities—such as boron, oxygen, nitrogen, sodium, arsenic, and phosphorus (but not water). It is also known in the art that silicon nitroxide layers that contain nitrogen in an amount corresponding to a nitrogen atomic concentration fraction [N/(N+O)] (simply called "nitrogen fraction" W' hereafter) in the approximate range of 0.10 to 0.20, especially approximately 0.12 to 0.14, are extremely effective barriers against both oxygen and silicon diffusion.

It is further known in the art that the surface of a silicon nitride layer decomposes rapidly at high temperatures in an oxygen ambient. The product of this decomposition is a silicon nitroxide layer whose composition ranges from almost pure oxide to almost pure nitride; therefore, in particular, a region of this layer has a nitrogen atomic fraction of about 0.12 to 0.14, and it is this region that is believed to be responsible for the effective barrier posed by the "silicon nitride" layer (compound layer of silicon nitroxide on silicon nitride) against the diffusion of oxygen.

Thus, workers in the art have proposed using a silicon nitroxide layer as a barrier layer for such purposes as sealing the gate oxide of an MOS transistor against undesirable diffusants. Such sealing in the case of an n-channel MOS transistor is needed in particular for protecting the oxide-semiconductor interface against the diffusion of arsenic or phosphorus (which is ordinarily used to dope the polysilicon gate electrode) from the gate electrode through the gate oxide; in the case of a p-channel transistor, against the diffusion of boron. Since boron (as well as some of its compounds) diffuses through the oxide more easily than arsenic or phosphorus, the problem of diffusion of impurities through the gate oxide can impose a more severe lower limit upon the gate oxide thickness in the case of p-channel MOS transistors (about 400 Angstroms) than in the case of n-channel transistors (about 100 to 200 Angstroms). Prior art techniques for thus sealing a thin gate oxide layer include forming such a silicon nitroxide layer at the top of the oxide layer, as by nitriding a silicon dioxide layer by heating it in ammonia gas. However, these techniques have resulted not only in the formation of the desired silicon nitroxide at the top of the gate oxide but also in an undesirable diffusion of significant amounts of nitrogen through the gate oxide to regions near the underlying silicon semiconductor to form nitrogen fractions higher than 0.13 whereby undesirable large numbers of trapping centers are formed that are deleterious to MOS transistor operation. Moreover, the formation of a silicon nitroxide barrier layer at the top of the gate oxide layer entails the presence of trapping centers in the nitroxide. During operation of the transistor, these trapping centers can become electrically charged by reason of, for instance, energetic ("hot") electrons from the semiconductor drifting into and occupying these centers, which can further adversely affect transistor operation by uncontrollably changing the transistor threshold voltage. Furthermore, during the prolonged high temperature treatments used in prior art to form the nitroxide layer, whether on a gate oxide of a single MOS transistor or on an isolation oxide between transistors (whether MOS or not), there can occur in the semiconductor itself an undesirable diffusion of impurities previously introduced into the semiconductor, whereby the impurity regions in the semiconductor (p-tubs, n-tubs, channel implants, channel stops) are undesirably affected not only by undesirable changes of impurity concentrations therein but also by undesirable movements of the junction profiles that define the boundaries between contiguous regions of opposite (p and n) conductivity types or of the same types but differing conductivity magnitudes.

It would therefore be desirable to have an integrated circuit comprising a silicon nitride barrier layer on a silicon dioxide dielectric layer that mitigates the problems in the prior art.

SUMMARY OF THE INVENTION

A nitrided silicon dioxide layer in accordance with the invention is characterized by a nitrogen fraction—N/(N+O)—that falls from a value of more than about 0.13 at a top surface of the nitrided layer to a value of about 0.13 at a first distance d of less than about 30 Angstroms from said top surface and to a value of less than about 0.05 at a second distance $d_2$ of less than about 60 Angstroms from said top surface, and remains less than about 0.05 in the layer everywhere at all distances greater than the second distance $d_2$ from said top surface, except that the nitrogen fraction can go as high as about 0.10 to 0.15 within distances of less than about 20 Angstroms from the bottom surface of the layer.

Such a nitrided layer can be formed by nitriding a top portion of a silicon dioxide layer located on an underlying semiconductor medium—such nitriding being performed by means of a rapid thermal annealing of the silicon dioxide layer to an elevated temperature, typically of about 1200 to 1250 degrees C. or more, in an ambient containing nitrogen, preferably pure ammonia. By "rapid thermal annealing" it is meant that the layer is heated from an initial relatively low temperature (such as room temperature) within a first relatively short time interval $t_1$ to the elevated temperature, is then maintained at this elevated temperature (at least approximately or somewhat higher) for a second relatively short time interval $t_2$, and immediately thereafter is cooled to a final relatively low temperature (as by radiation to the room) within a third relatively short time interval $t_3$. By the term "relatively low temperature" it is meant any temperature which is sufficiently low, typically about 500 degrees C. or less, so that diffusion of nitrogen or other significant impurity is unimportant either in the oxide or in the underlying semiconductor (if any). The initial and final relatively low temperatures may or may not be the same. Advantageously, the time intervals $t_1$, $t_2$, and $t_3$ are all about ten seconds or less but can usefully be as long as about a minute or two. In this manner, at a top portion of the thus nitrided silicon dioxide layer there is formed a desirable barrier layer of silicon nitroxide having a nitrogen fraction above about 0.13. The nitrogen profile in the nitrided layer is advantageously further characterized in that the nitrogen fraction falls from a value about 0.13 (typically about 0.35) at the top surface of the layer to a value of about 0.13 within a first distance d which, on the basis of Auger measurement, is believed to be about 15 to 25 Angstroms, and is assuredly less than about 30 Angstroms, as measured from this top surface of the layer. Furthermore, this nitrogen fraction advantageously falls to a value below about 0.05 at a distance $d_2$ equal to or less than the first distance ($d_2 \leq 2d$) from the top surface of the thus nitrided silicon dioxide layer, and advantageously the nitrogen fraction also stays less than this value of about 0.05 in the layer all the way down to a third distance x of about 20 Angstroms or less from the interface with the underlying semiconductor medium. Moreover, in the (bottom) region of the layer within this third distance x from the interface with the underlying semiconductor medium, a nitrogen fraction of somewhat more than 0.05—namely, as much as about 0.15—can be present, so long as there is a remaining intermediate region (whose top extremity is located at the second distance $d_2$ from the top surface of the layer and whose bottom extremity is located at the third distance x from the interface of the layer with the underlying semiconductor medium) in which the nitrogen fraction is everywhere less than about 0.05. Accordingly, the sum of the second distance $d_2$ and the third distance x is less than the thickness of the nitrided silicon dioxide layer (in order for there to be a remaining intermediate region). The relatively low value of about 0.05 for the nitrogen fraction in the intermediate region prevents undesirable segregation of nitrogen toward the underlying semiconductor medium.

In any event, the nitrided silicon dioxide layer everywhere at all distances greater than the second distance $d_2$ from the top surface is thus advantageously free of any significant amounts of nitrogen species. By "nitrogen species" it is meant any nitrogen whether or not it is bonded to other atoms.

In order to ensure that the value of about 0.13 is actually attained for the nitrogen fraction at least somewhere in the nitrided oxide layer—and thus ensure that the distance d is positive and hence ensure that the desirable barrier layer is formed somewhere in the resulting nitrided oxide layer—the rapid thermal annealing time or temperature (or both) is adjusted so that the nitrogen fraction that results at the top surface of the nitrided oxide layer is greater than about 0.13. The distance d can thus be viewed as the (effective) thickness d of a silicon nitroxide portion of a compound layer consisting of a silicon nitroxide portion on a silicon dioxide portion, or as the (effective) thickness of a silicon nitroxide layer located on a silicon dioxide layer.

This thickness d of the silicon nitroxide layer, when formed by sufficiently rapid thermal annealing at sufficiently high temperature (in particular, about 1200 degrees C.), tends to be self-limited to about 30 Angstroms or less. It is theorized that this self-limiting occurs because the silicon nitroxide layer formed by sufficiently rapid thermal annealing at sufficiently high temperatures acts as an effective barrier against further diffusion of nitrogen deeper into the underlying silicon dioxide as soon as that thickness of nitroxide is formed, that is, before significant amounts of nitrogen have had a chance to diffuse deeper into the silicon dioxide. However, it should be understood that the successful practice of the invention does not depend upon the correctness of this or any theory. Furthermore, this relatively small thickness d of the silicon nitroxide is theorized to be small enough to enable direct tunneling from an overlying metal layer, such as a gate electrode in a MOS transistor, directly contacting the top surface of the silicon nitroxide to any trapping centers that are located in the silicon nitroxide within this distance d, whereby undesirable charging of the trapping centers will be desirable discharged. At the same time, the remaining silicon dioxide layer (underlying the silicon nitroxide layer) is relatively free of nitrogen.

Thus, this invention involves a compound layer consisting essentially of a silicon nitroxide portion on a silicon dioxide portion in which the nitrogen fraction falls from a value greater than 0.13 at the top surface of the compound layer to a value of about 0.13 at a first distance d of about 30 Angstroms (or less) and to a value of about 0.05 (or less) at a second distance ($d_2 \leq 2d$) as measured from this top surface, and stays below this value of about 0.05 throughout the remainder of the way down from this distance $d_2$ to a distance x of about 20 Angstroms or less from the bottom surface of the compound layer, and the nitrogen fraction in the layer is less than about 0.15 everywhere within the distance x from the bottom surface of the compound layer. Thus, the compound layer of silicon nitroxide on silicon dioxide can be used to seal an underlying medium, such as a semiconductor, from such undesired impurities in the ambient as boron, oxygen, nitrogen, sodium, arsenic, and phosphorus.

An MOS capacitor, having as a dielectric a compound layer of silicon nitroxide on silicon dioxide in accordance with the invention, has been successfully built and tested as to its capacitance-voltage profile over a voltage range of about 5 volts of both polarities, thereby demonstrating an absence of undesirable charge trapping phenomena.

In a specific embodiment of the invention, an MOS transistor in an integrated circuit has a compound layer of silicon nitroxide on silicon dioxide having a thickness in the approximate range of 50 to 400 Angstroms separating an overlying gate electrode from an underlying major surface of a semiconductor medium in which the circuit is integrated. The gate electrode is composed of a metal-like (metal silicide) layer directly contacting the top surface of the nitroxide layer. In this way, because of the presence of the gate electrode and the small thickness d of the nitroxide layer, it is believed that direct tunneling of charge carriers between the gate electrode and trapping centers in the silicon nitroxide, whereby undesirable nonuniformities in the electric field, and hence undesirable nonuniformities in the threshold voltages of underlying regions of the transistor channel in the underlying semiconductor medium—which would otherwise be produced by the charging of these trapping centers during operation—are desirably suppressed.

It should be understood that other embodiments are encompassed by the invention, such as an integrated circuit in which the nitrided silicon dioxide layer overlies a semiconductor medium at areas between transistors integrated therein, so that the layer can serve as passivation dielectric for electrically isolating the transistors from one another and at the same time preventing undesired impurities from entering the semiconductor from the ambient.

BRIEF DESCRIPTION OF THE DRAWING

This invention together with its characteristics, features, and advantages may be better understood from the following detailed description when read in conjunction with the drawing in which.

Figure 1:
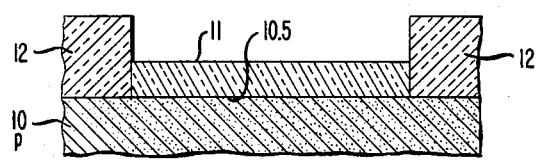
FIGS. 1–5 depict an illustrative cross section of a portion of an integrated circuit including an MOS transistor, during various successive manufacturing stages of the circuit in accordance with a specific embodiment of the invention. Only for the sake of clarity, none of the drawings is to any scale.

It should be understood that, although the portion of the integrated circuit illustrated in the drawings includes only a single transistor at a major surface of a semiconductor medium, many similar such transistors are simultaneously manufactured at different locations on the same major surface of the semiconductor and are then electrically interconnected in accordance with the ultimately desired electrical circuit.

DETAILED DESCRIPTION

In order to manufacture an integrated circuit having an MOS transistor with a nitrided silicon dioxide gate dielectric, and as shown in FIG. 1, a top major surface 10.5 of a p-type monocrystalline silicon semiconductor medium 10 is coated with a relatively thick field oxide layer 12, which has been thermally grown by conventional means to a uniform thickness of typically about 3,000 Angstroms, and a relatively thin gate oxide layer 11, which has been thermally grown by conventional means to a uniform thickness of about 100 Angstroms. This field oxide thickness can usefully also be in the approximate range of 2,000 to 5,000 Angstroms; and this gate oxide thickness, in the approximate range of 50 to 200 Angstroms. As also known in the art, a localized surface channel stop implant region (not shown) in the semiconductor underlies the field oxide to suppress spurious channels, and a localized surface channel implant region (not shown) in the semiconductor underlies the gate oxide to ensure the desired transistor threshold voltage.

Figure 2:
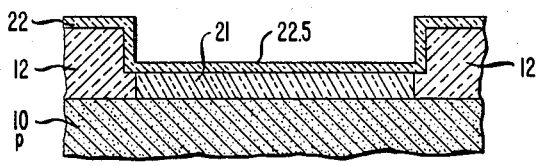

Then, as shown in FIG. 2, the top portions of the field oxide and gate oxide layers are nitrided to form a silicon nitroxide layer 22. In particular, there is formed a relatively thin composite dielectric layer consisting essentially of a silicon nitroxide portion 22 on the remaining silicon dioxide portion 21 having the above prescribed nitrogen fraction profile. For example, the nitrogen fraction at the top surface 22.5 of the nitroxide portion 22 (and hence at the top surface of the composite dielectric layer) is about 0.35, and it falls to about 0.13 at a distance in the range of about 15 to 25 Angstroms beneath this top surface 22.5 of the layer 22, and to less than 0.05 everywhere at distances of greater than about 60 Angstroms beneath this top surface 22.5.

In order thus to form the composite dielectric, the structure shown in FIG. 1 is initially at room temperature and is placed in an RTA (rapid thermal annealing) chamber of a heating apparatus, for example, of the kind described in a paper entitled "Recrystallization of Polysilicon Films Using Incoherent Light," authored by A. Kamgar and E. Labate, published in *Materials Letters*, Vol. 1, No. 3, 4, at pp. 91–94 (December 1982). The chamber in which the structure is placed is subjected to a flow of commercially available ultra-high pure ammonia at a flow rate of one cm/sec at essentially atmospheric pressure. The power delivered to the tungsten lamps which act as the heating source for the rapid thermal annealing is adjusted so that the temperature (as measured by a pyrometer) of the structure goes from room temperature to an elevated temperature of about 1250 degrees C. (or more) within about 10 seconds and remains at 1250 degrees C. (or somewhat still more, such as up to about 1300 degrees C.) for another 10 seconds. Immediately thereafter, the power to the tungsten lamps is shut off, and thereby the structure cools to about 500 degrees C. within yet another 10 seconds.

Although the elevated temperature was measured as 1250 degrees C., there is a possible error of as much as 50 degrees, so that the elevated temperature may actually have been as low as 1200 degrees C. or as high as 1300 degrees C. Moreover, the elevated temperature as thus measured may be made to be as high as 1300 degrees C. or more during the heating in which case the time during which the temperature of the structure is made to remain at the elevated temperature is correspondingly reduced to less than 10 seconds.

Figure 3:
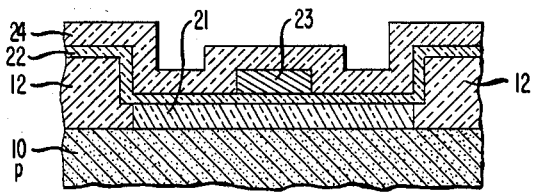
Figure 4:
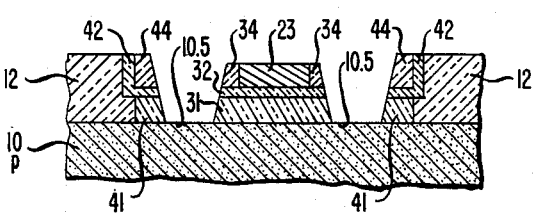

Next, as indicated in FIG. 3, a polycrystalline silicon layer 23, typically about 1,500 Angstroms thick, is deposited and patterned by conventional methods to form a localized polysilicon electrode layer 23. Then a TEOS (tetra ethyl ortho silicate) layer 24, typically about 2,500 Angstroms thick, is deposited by conventional means. Next (FIG. 4), the structure is anisotropically etched, as by reactive ion etching with ions, whereby the top surface of the polysilicon layer 23 and portions of the top major surface 10.5 of the semiconductor are laid bare. Thus, a silicon dioxide portion 31 and a silicon nitroxide portion 32 (both stemming from the thin oxide layer 21) remain in the central region, another silicon dioxide portion 41 and another silicon nitroxide portion 42 (also both stemming from the thin oxide layer 21) likewise remain in the peripheral region contiguous with the field oxide 12, a TEOS sidewall portion 34 remains on the sidewall of the polysilicon layer 23, and another TEOS portion 44 remains on the silicon nitroxide portion 42.

Figure 5:
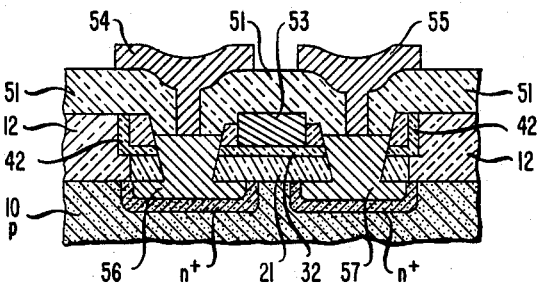

Then a silicide forming metal, such as cobalt or titanium, is deposited to a thickness of typically about 1,500 Angstroms and is sintered to form metal silicide in those regions thereof overlying silicon, and is wet etched with an etching solution, such as aqua regia, which removes the metal but not the metal silicide or the oxides (including TEOS). Thus (FIG. 5), there are formed a metal silicide gate electrode layer 53, a metal silicide source electrode 56, and a metal silicide drain electrode 57. The structure is then subjected to a phosphorus diffusion step, whereby the phosphorus diffuses into metal silicide gate electrode 53, as well as through the metal silicide source and drain electrodes into the underlying silicon semiconductor to form n+ regions that are aligned with the edges of the gate electrode 53 as understood in the art.

Then an undoped glass layer 51 is deposited, to a thickness of typically about 5,000 Angstroms, and patterned with windows to enable electrical access to the source and drain electrodes. It should be understood that, for access to the gate, the gate electrode layer 53 ordinarily extends in a direction perpendicular to the plane of FIG. 5 to a region overlying field oxide where the undoped glass layer 51 also extends and can be provided with a window for access to the gate electrode. Finally, an aluminum layer is deposited and patterned (as well as further interconnections, as known in the art) to form access metallizations 54 and 55 for the source and drain electrodes 56 and 57 in accordance with the desired integrated circuit interconnections.

It should be understood that by suitably masking the anisotropic etching of the TEOS layer 24, removal of silicon nitroxide from the field oxide can be avoided, and the silicon nitroxide portion 42 can then extend laterally and horizontally over the field oxide 12 for passivation and isolation purposes.

Although the invention has been described in detail in terms of an illustrative specific embodiment, various modifications can be made without departing from the scope of the invention. For example, other semiconductors, such as gallium arsenide, can be used instead of silicon as the semiconductor medium, and the silicon nitroxide can overlie the semiconductor only at areas between active devices, such as transistor devices.

What is claimed is:

1. A nitrided silicon dioxide layer having a top surface and a bottom surface, the nitrogen fraction at the top surface of the layer being greater than 0.13, the nitrogen fraction in the layer falling to a value below about 0.13 at a first distance of about 30 Angstroms or less from said top surface and to a value below about 0.05 at a second distance of about twice the first distance or less from said top surface.

2. The nitrided silicon dioxide layer of claim 1 in which the nitrogen fraction in the layer stays below 0.05 everywhere in an intermediate region thereof whose top extremity is located at the second distance from the top surface of the layer and whose bottom extremity is located at a third distance of about 20 Angstroms or less from the bottom surface of the layer.

3. The nitrided silicon dioxide layer of claim 2 in which the nitrogen fraction rises to no more than about 0.15 in a bottom region of the layer extending from the bottom surface of the layer to the bottom extremity of the intermediate region.

4. A semiconductor integrated circuit comprising a nitrided silicon dioxide layer in accordance with claim 1.

5. The circuit of claim 4 having an MOS transistor in which the gate dielectric thereof is the nitrided dioxide layer.

6. The circuit of claim 5 in which the thickness of the nitrided silicon dioxide layer is in the approximate range of 50 to 400 Angstroms.

7. A compound layer consisting essentially of a silicon nitroxide portion on a silicon dioxide portion characterized in that the nitrogen fraction falls from a value greater than 0.13 at the top surface of the compound layer to a value of about 0.13 at a first distance d of about 30 Angstroms or less and to a value of about 0.05 (or less) at at second distance less than twice the first distance d as measured from this top surface.

8. A semiconductor integrated circuit comprising a layer in accordance with claim 7.

9. The circuit of claim 8 having an MOS transistor in which the gate dielectric thereof is the composite dielectric layer.

10. The circuit of claim 9 in which the thickness of the nitrided silicon dioxide layer is in the approximate range of 50 to 400 Angstroms.

11. The circuit of claim 9 in which the thickness of the layer is in the approximate range of 50 to 200 Angstroms.

* * * * *